United States Patent [19]
Cheng

[11] Patent Number: 5,917,191
[45] Date of Patent: *Jun. 29, 1999

[54] APPARATUS FOR MEASURING SURFACE TOPOGRAPHY

[75] Inventor: David Cheng, Sunnyvale, Calif.

[73] Assignee: Ann F. Koo, Los Altos, Calif.

[ * ] Notice: This patent is subject to a terminal disclaimer.

[21] Appl. No.: 08/977,832

[22] Filed: Nov. 26, 1997

Related U.S. Application Data

[62] Division of application No. 08/613,674, Mar. 11, 1996, Pat. No. 5,708,279, which is a continuation of application No. 08/317,115, Oct. 3, 1994, Pat. No. 5,532,499, which is a division of application No. 08/225,425, Apr. 8, 1994, Pat. No. 5,369,286, which is a continuation of application No. 08/144,141, Oct. 27, 1993, abandoned, which is a division of application No. 07/876,576, Apr. 30, 1992, Pat. No. 5,270,560, which is a continuation-in-part of application No. 07/822,910, Jan. 21, 1992, Pat. No. 5,233,201, which is a continuation-in-part of application No. 07/357,403, May 26, 1989, Pat. No. 5,118,955.

[51] Int. Cl.$^6$ ............................................. G01N 21/86
[52] U.S. Cl. ........................... 250/559.22; 356/376
[58] Field of Search ................... 250/559.22, 559.24, 250/559.27, 559.4; 356/376, 377, 381

[56] References Cited

U.S. PATENT DOCUMENTS

| | | | |
|---|---|---|---|
| 3,406,292 | 10/1968 | Geier et al. | 356/371 |
| 3,679,307 | 7/1972 | Zoot et al. | 356/4 |
| 4,145,140 | 3/1979 | Fujii | 356/37 |
| 4,297,034 | 10/1981 | Ito et al. | 356/376 |
| 4,386,272 | 5/1983 | Check, Jr. et al. | 250/23 |
| 4,432,239 | 2/1984 | Bykov | 73/800 |
| 4,506,149 | 3/1985 | Utsumi | 250/202 |
| 4,566,797 | 1/1986 | Kaffka et al. | 356/402 |
| 4,667,113 | 5/1987 | Nakajima et al. | 250/559.4 |
| 4,667,316 | 5/1987 | Suda et al. | |
| 4,672,196 | 6/1987 | Canino | |
| 4,788,421 | 11/1988 | Ogawa et al. | 250/201 |
| 4,815,857 | 3/1989 | Bragd | 356/376 |
| 4,900,940 | 2/1990 | Nakamura | 356/376 |
| 4,986,664 | 1/1991 | Lovoi | 356/376 |
| 5,029,245 | 7/1991 | Keränen et al. | 250/205 |
| 5,118,955 | 6/1992 | Cheng | 250/559.23 |
| 5,122,648 | 6/1992 | Cohen et al. | 250/201.3 |
| 5,134,303 | 7/1992 | Blech et al. | 250/559.3 |
| 5,162,642 | 11/1992 | Akamatsu et al. | 250/201.6 |
| 5,229,619 | 7/1993 | Van Amstel | |
| 5,248,889 | 9/1993 | Blech et al. | 250/559.28 |
| 5,270,560 | 12/1993 | Cheng | 250/559.23 |
| 5,369,286 | 11/1994 | Cheng | 250/559.36 |
| 5,523,582 | 6/1996 | Cheng | 250/559.22 |

*Primary Examiner*—Que T. Le
*Attorney, Agent, or Firm*—Hickman Stephens & Coleman, LLP

[57] ABSTRACT

A method for measuring surface topography characterized by making multiple scans of the surface with a laser scanning unit and utilizing the multiple scans to create representations of the surface's topography. The surface topography data can also be used to calculate the compressive or tensile stress caused by a thin film applied to the surface of a semiconductor wafer. The apparatus of the present invention scans a laser beam across a surface in an x direction, and detects displacements of a reflected portion of the laser beam in a z direction. A pair of photodetectors are used to translate z direction displacements of the reflected beam into analog signals which are digitized and input into a microcomputer for analysis. The multiple scans of the surface are preferably accomplished by placing the workpiece on a pedestal which can be rotated to various angular positions.

17 Claims, 13 Drawing Sheets

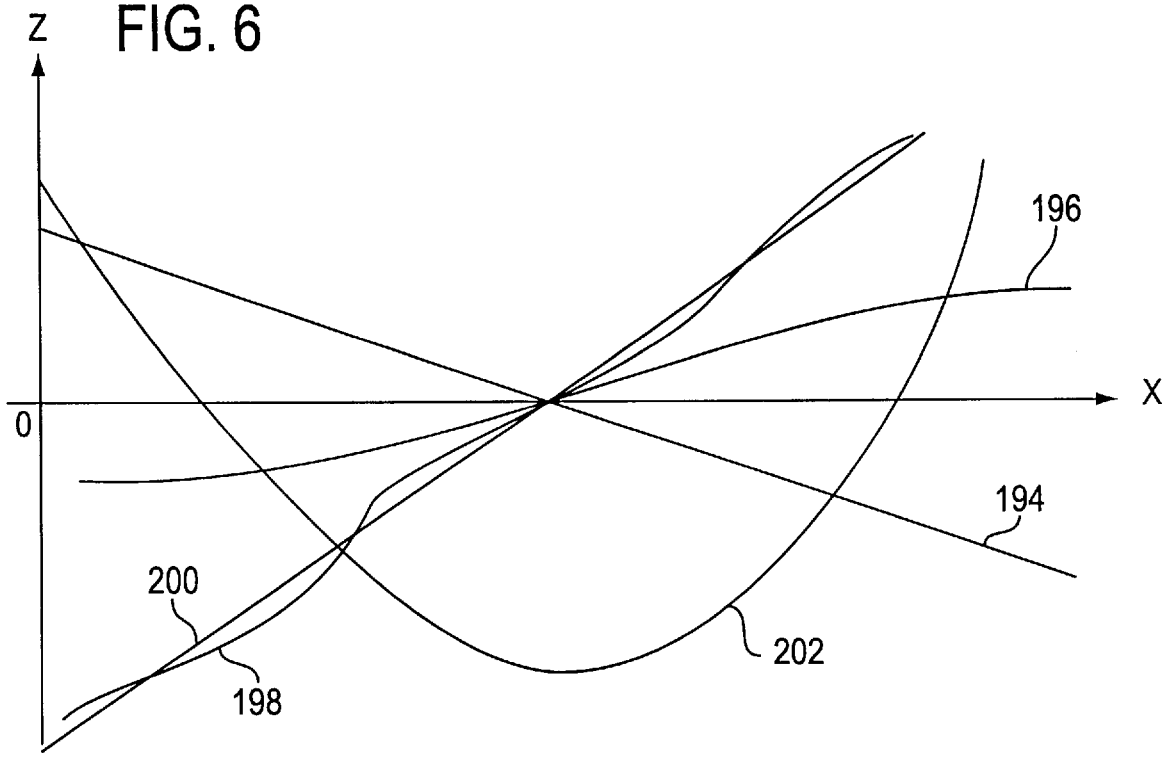
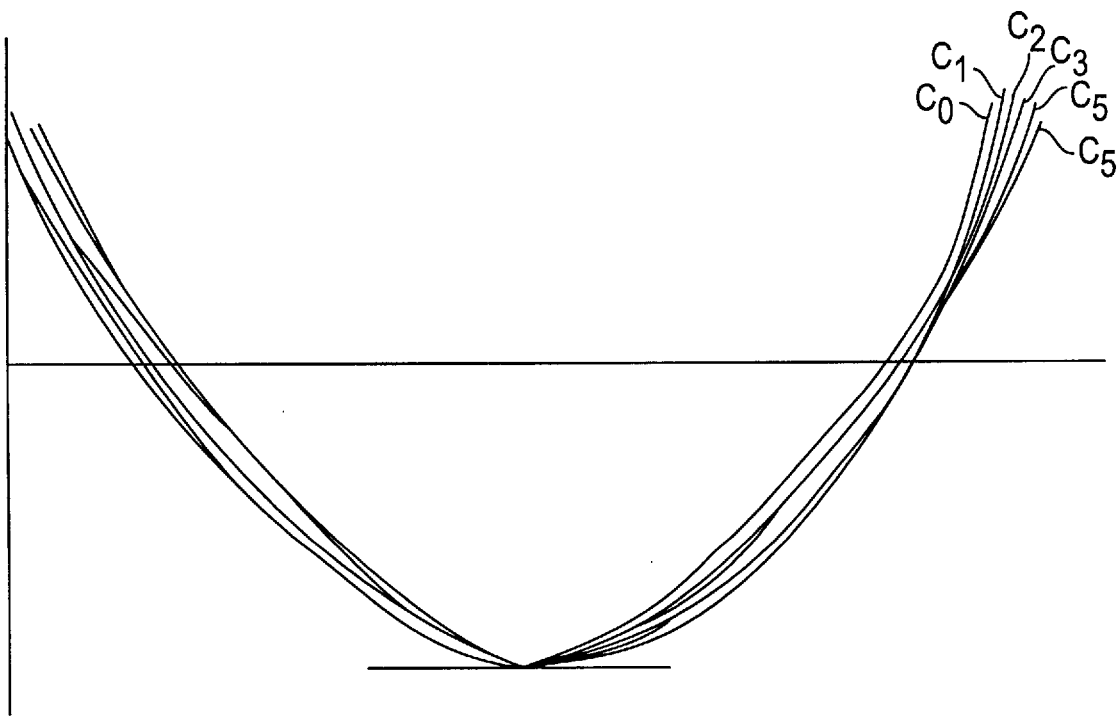

APPARATUS FOR MEASURING SURFACE TOPOGRAPHY

CROSS REFERENCE TO RELATED APPLICATIONS

This is a Divisional application of copending prior application Ser. No. 08/613,674 filed on Mar. 11, 1996, now U.S. Pat. No. 5,708,279, which is a continuation of application Ser. No. 08/317,115 filed on Oct. 3, 1994, now U.S. Pat. No. 5,532,499, which is a divisional application of Ser. No. 08/225,425 filed on Apr. 8, 1994, now U.S. Pat. No. 5,369,286, which is a continuation of application U.S. Ser. No. 08/144,141, filed Oct. 27, 1993, now abandoned, which is a divisional of application U.S. Ser. No. 07/876,576, filed Apr. 30, 1992, now U.S. Pat. No. 5,270,560, which is a continuation-in-part of application U.S. Ser. No. 07/822,910, filed Jan. 21, 1992, now U.S. Pat. No. 5,233,201, which is a continuation-in-part of U.S. Ser. No. 07/357,403, filed May 26, 1989, now U.S. Pat. No. 5,118,955, all applications being commonly assigned herewith, the disclosures of which are hereby incorporated by reference herein in their entirety.

BACKGROUND OF THE INVENTION

This invention relates generally to methods and apparatus for measuring surface topographies and more particularly to methods and apparatus for measuring the surface topographies of semiconductor wafers, hard disk platters, optical blanks and other high-tolerance workpieces.

Integrated circuits are formed on semiconductor wafer substrates by a number of processing steps. These steps include deposition, etching, implantation, doping, and other semiconductor processing steps well known to those skilled in the art.

Thin films are typically formed on wafer surfaces by a deposition process. These thin films can comprise, for example, silicon dioxide, AlSi, Ti, TiN, PECVD Oxide, PECVD Oxynitride, doped glasses, silicides, etc. The thickness of such films usually ranges from about a few hundred angstroms to several micrometers. Often, three or more film layers are formed on the surface of a single semiconductor wafer.

In the art of fabricating semiconductor wafers, it is of known importance to minimize or control stresses in surface films. High surface stresses can cause, for example, silicide lifting, the formation of voids or crack and other conditions that adversely affect semiconductor devices (i.e. chips) which are fabricated on the wafers. In practice, surface stresses become more problematical as the level of circuit integration increases, and are especially troublesome when fabricating large scale integration (LSI), very large scale integration (VLSI), and ultra large scale integration (ULSI) semiconductor devices.

The stress in the surface film of a semiconductor wafer can be either compressive or tensile. A compressive stress in a surface film will cause a wafer to slightly bow in a convex direction, while a tensile stress in a surface film will cause a wafer to slightly bow in a concave direction. Therefore, both compressive and tensile stresses cause the surface of the semiconductor wafer to deviate from exact planarity. The extent of the deviation from planarity can be expressed in terms of the radius of curvature of a wafer surface. In general, the greater the magnitude of surface stress, the smaller the radius of curvature.

Because of the problems that can be caused by stresses in surface films on semiconductor wafers, it is highly desirable to be able to measure such stresses. The measurements can be used, for example, to identify wafers that are likely to provide low yields of semiconductor devices or which might produce devices prone to early failure. In normal practice, stresses in surface films are not measured directly but, instead, are inferred from measurements of the radius of curvature of the surface of interest.

A system for measuring film stress by measuring the radius of curvature of a wafer is described in an article entitled "Thermal Stresses and Cracking Resistance of Dielectric Films on Si Substrates," A. K. Sinha et. al., Journal of Applied Physics, Vol. 49, pp. 2423–2426, 1978. Other systems are described in copending patent application Ser. No. 07/822,910, filed Jan. 21, 1992 and U.S. Ser. No. 07/357,403, filed May 26, 1989. All of these systems linearly scan across a wafer to determine the curvature of the wafer along that scan line. This type of wafer scanning can be referred to as a "1-D" linear scan reflecting the fact that it is a one-dimensional scan of the wafer's surface, such as in the x direction. A 1-D scan is quite effective for wafers having fairly uniform surface topographies and uniform film layers, but may be less than adequate for more complex surface topographies or for film layers that are somewhat uneven. This is because the radius of curvature for such wafers may be significantly different when taken along different scan lines along the surface of the wafer. If the particular scan line chosen provides a radius of curvature is which far from the average radius of curvature, the film stress calculated from the radius of curvature will be incorrect.

There are other applications for a method and apparatus for measuring surface curvature besides determining the mechanical stress in films. For example, it is often desirable to know the surface curvature (i.e. the "flatness") of hard disk platters or the radius of curvature of optical elements. In the prior art, such curvature measurements were made by expensive laser interferometry equipment.

SUMMARY OF THE INVENTION

A method for measuring the topography of a surface in accordance with the present invention involves scanning a laser beam across the surface along a first scan line, detecting a reflected portion of the beam to develop first scan data, scanning the laser beam across a second scan line which intersect the first scan line at a predetermined angle, detecting a reflected portion of the beam to develop second scan data, and utilizing the first scan data and the second scan data to represent the topography of the surface. Preferably, second scan of the wafer is accomplished by rotating either the scanning mechanism or the surface by a predetermined angle $\phi=360/N_s$ degrees, where $N_s$ is the number of scans of the surface.

In a preferred embodiment, the first scan line and the second scan line are aligned at a reference point. This can be accomplished by choosing an arbitrary reference point on a curve derived from data from the first scan, and aligning a corresponding point on a curve derived from data from the second scan with the reference point. The multiple scans can be used to provide a three dimensional representation of the curvature of the surface, or a two dimensional contour map of the surface.

A further method in accordance with the present invention involves scanning a surface of a workpiece prior to the deposition of a film to obtain blank displacement data and then scanning the surface of the workpiece after film deposition to obtain deposited displacement data. These two sets of data are subtracted to eliminate the effects of the intrinsic curvature of the surface. Preferably, multiple scans are made both before and after film deposition to provide the aforementioned advantages of multiple scanning.

An apparatus of the present invention includes a scanning unit and a data processing unit. The scanning unit has a diode laser which can scan a beam spot across the surface of a workpiece in an x direction. A beam detector detects z direction displacements of a reflected portion of the laser beam caused by the surface curvature of the workpiece and outputs a signal representative of that displacement. This signal is digitized and can be analyzed to determine surface curvature, contours, and film stress.

The beam detector utilizes a pair of adjacent photodetectors which, when combined with the detector circuitry of the present invention, provide an output which indicates the relative position of the reflected beam spot.

An advantage of the present invention is that multiple scans of the workpiece surface provides a better understanding of the topography of the wafer surface and also provides a better estimate of the stress inherent in a film applied to the surface of a semiconductor wafer.

These and other advantages of the present invention will become apparent to those skilled in the art upon a reading of the following specification of the invention and a study of the several figures of the drawing.

BRIEF DESCRIPTION OF THE DRAWINGS

FIG. 6 is a graph illustrating various system outputs for one scan across a wafer surface;

FIG. 7 is a graph illustrating six surface curvatures taken from six scans across a wafer surface;

DETAILED DESCRIPTION OF THE PREFERRED EMBODIMENTS

Figure 1:
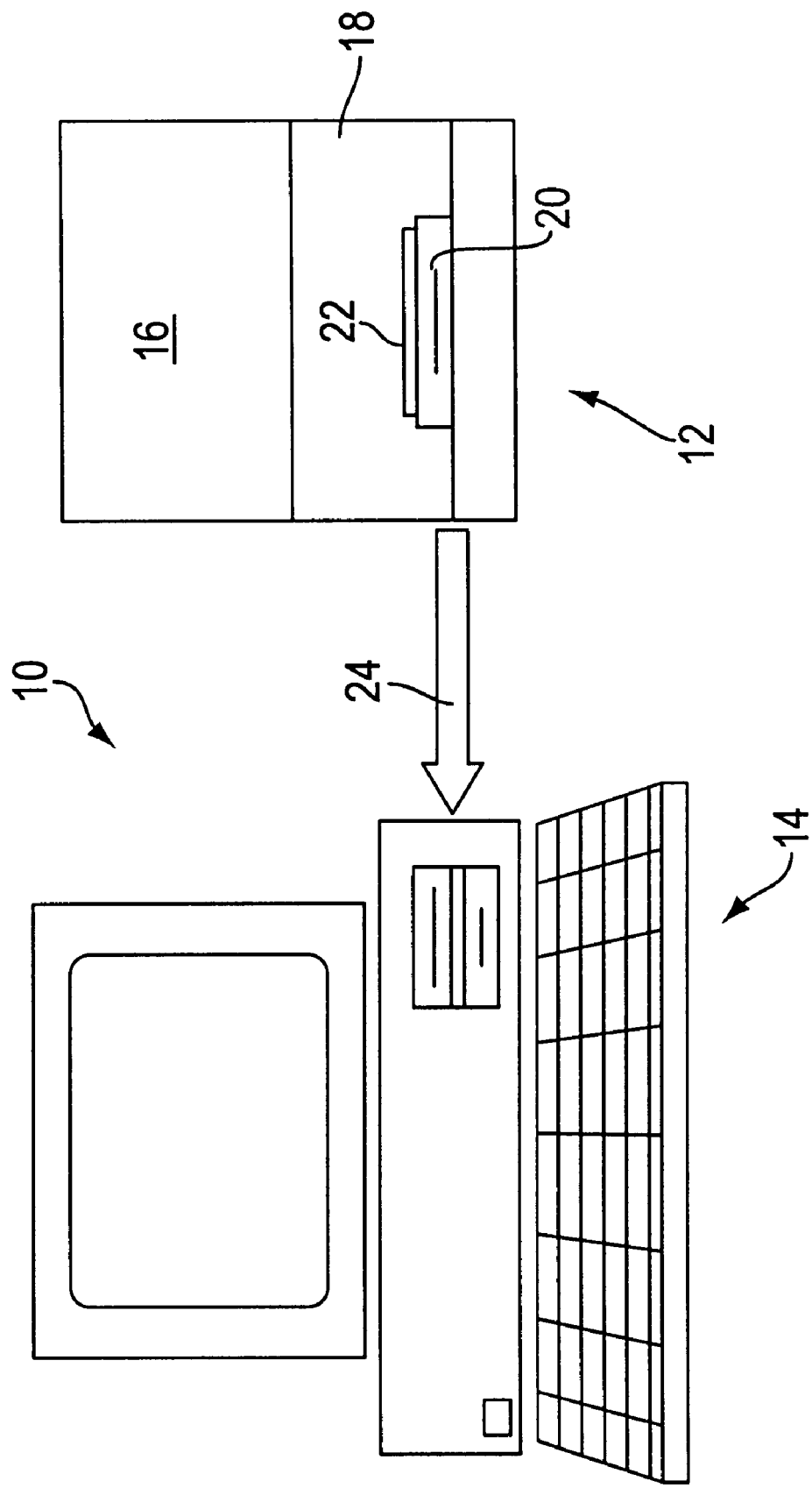
FIG. 1 is a pictorial view of an apparatus for measuring surface topography in accordance with the present invention.

In FIG. 1, a surface topography measuring apparatus 10 includes a scanning unit 12 and a data processing unit 14. The scanning unit 12 includes an enclosure 16 having a front access or opening 18, and a rotatable pedestal 20 accessible through the opening 18. A workpiece, such as a wafer 22, rests on pedestal 20. While the present invention will be discussed in terms of measuring the curvature of a semiconductor wafer, such as wafer 22, it should be understood that this invention can be used to non-destructively measure the surface topography of a variety of workpieces, including hard disk platters, optical blanks, etc. As used herein, "topography" refers to any description of a surface of a workpiece, such as curvature, contours, etc.

Data processing unit 14 preferably comprises a commercially available personal computer, such as an IBM-PC AT class personal computer or equivalent. A data bus 24 couples the scanning unit 12 to the data processing unit 14. Preferably, the data processing unit 14 has an appropriate I/O card with A/D converters plugged into one of its expansion slots such that analog data produced by scanning unit 12 on bus 24 can be converted into digital data for the data processing unit 14. Alternatively, scanning unit 12 can provide digital data on bus 24, which can enter data processing unit 14 through an existing digital I/O port such as an RS-232C serial port. Appropriate control busses may also connect data processing unit 14 to the scanning unit 12 in a manner well known to those skilled in the art.

Figure 2:
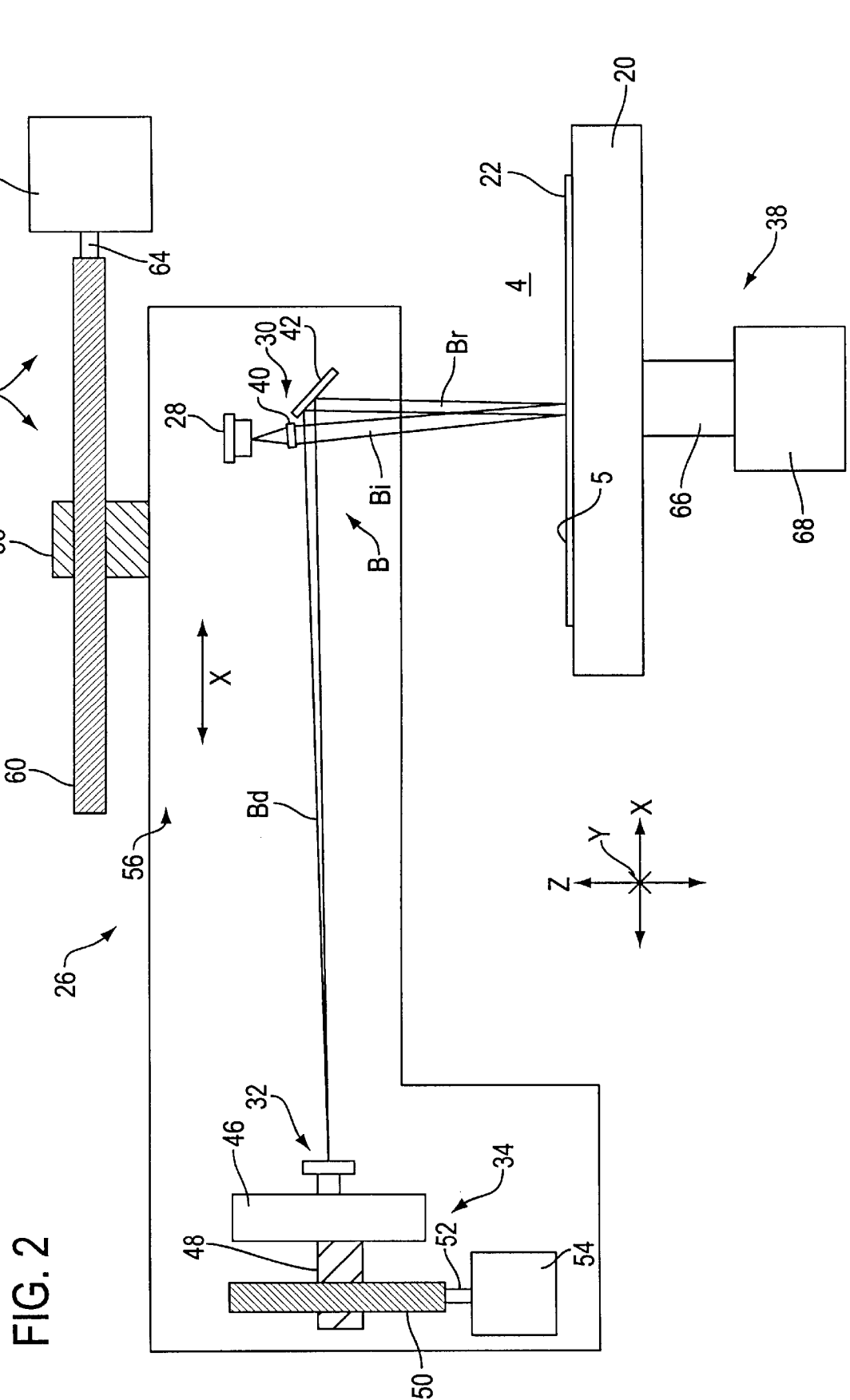
FIG. 2 is a pictorial view of the scanning mechanism of the scanning unit illustrated in FIG. 1.

FIG. 2 illustrates a portion of the scanning mechanism 26 housed within the enclosure 16 of FIG. 1. The mechanism 26 includes a diode laser 28, a beam directing assembly 30, a beam detector 32, a z stage assembly 34, an x stage assembly 36, and a pedestal assembly 38 including the aforementioned pedestal 20.

Diode laser 28 is preferably a Class IIIb laser product certified by the Federal Food and Drug Administration under FDA 27 CFR 1040, 10(f)(5)(ii) and preferably operates at a wavelength of approximately 780 nm. A typical maximum power output of the laser 28 is less than 2 mW.

The beam directing assembly 30 includes a converging lens 40 and a front silvered mirror 42. The converging lens 40 should have a focal length which allows a beam B produced by laser 28 to form a beam spot on the wafer surface s of about 3 mm in diameter and a beam spot on the detector 32 which is approximately 20–50 $\mu$m in diameter. The laser 28 forms an incident beam Bi which impinges upon the surface of the wafer 22. The surface s of the wafer 22 reflects a portion of the incident beam Bi as a reflected beam Br. The reflected beam Br impinges upon the reflective surface of mirror 42 and is reflected towards the beam detector 32 as a directed beam Bd. Therefore, beam B comprises the sum of beams Bi, Br, and Bd. The effective reflected beam path length comprising beam Br and Bd is about 300 mm.

The beam detector 32 preferably includes a photodetector assembly which will be described in greater detail subsequently. The beam detector 32 is responsive to the position along a z axis of the beam spot developed by beam Bd and is operative to produce an electrical signal representative of the z position. The z stage assembly 34 includes a z stage 46 including a nut 48 engaged with a lead screw 50. The lead screw 50 is driven by a shaft 52 of a stepper motor 54. Rotation of the shaft 52 causes the z stage 46 and, therefore, the beam detector 32 to translate upwardly or downwardly in a direction parallel to the z axis. The stepper motor 54 has the characteristic that it can be operated to move stage 46 in discrete, reproducible increments. In practice, such increments result in advancing or retracting the stage 46 in the z direction in increments of about 0.6 microns.

The x stage assembly 36 includes an x stage 56 which supports the diode laser 28, the beam directing assembly 30, the beam detector 32, and the z stage assembly 34. The x stage assembly 36 also includes a nut 58 coupled to the x stage 56, a lead screw 60 engaged with the nut 58, and a stepper motor 62 having a shaft 64 coupled to the lead screw 60. Again, the lead screw and stepper motor are conventional and permit the stage 56 to be moved incrementally along the x axis. In practice, such increments result in advancing or retracting the stage 56 in incremental distances of about 0.025 mm.

The pedestal assembly 38 includes the aforementioned pedestal 20, which is preferably disk shaped and has a diameter somewhat larger than the diameter of the wafer 22 (or other workpiece) that it is intended to support. The pedestal 20 is, itself, supported by a drive reduction mechanism 66 coupled to the shaft of a stepper motor 68. The stepper motor 68 is operative rotate pedestal 20 and wafer 22 around an axis parallel to the z axis. In other words, the wafer 22 is caused to rotate parallel to or in the x-y plane, where the y axis extends perpendicularly to the plane of the paper. The incremental angle φ of rotation of the pedestal 20 is preferably given by the equation:

$$\phi = 360/Ns \qquad \text{(equation one)}$$

where Ns is the number of scans across the upper surface s of the wafer 22. The rotational resolution of the stage is typically in the range of 0.1 to 0.01 degrees.

Figure 3:
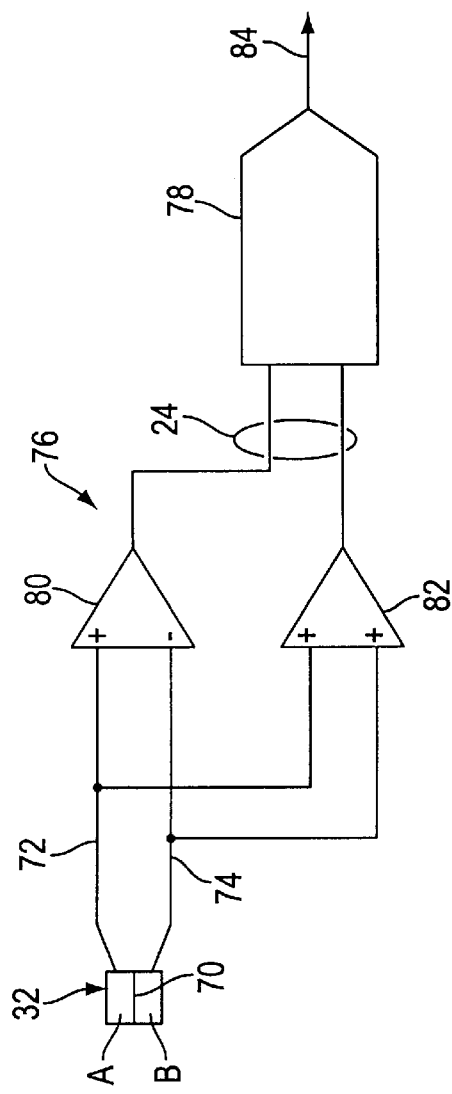
FIG. 3 is a schematic of the beam detector, bus driver, and bus interface of the present invention.

In FIG. 3, the beam detector 32 includes a first photodetector A and a second photodetector B. Photodetectors A and B can be conventional devices such as silicon PIN diodes. Photodetectors A and B are substantially rectangular in configuration and abut along one of their longer sides along a line 70. Photodetector A develops an electrical output signal on a line 72 which is related to the energy of the electromagnetic radiation impinging upon its surface, and photodetector B develops an electrical output signal on a line 74 which is related to the energy of the electromagnetic radiation impinging upon its surface. More specifically, the electrical output signals on lines 72 and 74 are analog signals having amplitudes which vary with the intensity of the beam Bd, its frequency, and the size of the spot which the beam Bd projects onto the beam detector 32.

FIG. 3 also shows a bus driver 76 which drives data bus 24 and a computer interface circuit 78. The bus driver 76 includes a differential-voltage operational amplifier 80 and a summing amplifier 82. In practice, both operational amplifier 80 and summing amplifier 82 are conventional integrated operational amplifier devices, where the summing amplifier is embodied as an operational amplifier with an inverter at its negative input terminal. Line 72 is coupled to the positive input terminal of operational amplifier 80 and to one of the positive input terminals of summing amplifier 82. Line 74 is coupled to the negative input terminal of operational amplifier 80 and to a positive input terminal of summing amplifier 82. The outputs of operational amplifier and summing amplifier 82 drive the data bus 24 connected between the scanning unit 12 and the data processing unit 14.

The computer interface circuit 78 is typically a card which plugs into the expansion bus of data processing unit 14 and primarily comprises A/D converters which to convert the analog signals on data bus 24 to digital values on digital output bus 84. The digital output on bus 84 can be stored in temporary and/or permanent memory of the data processing unit 14 for subsequent processing.

Figure 4:
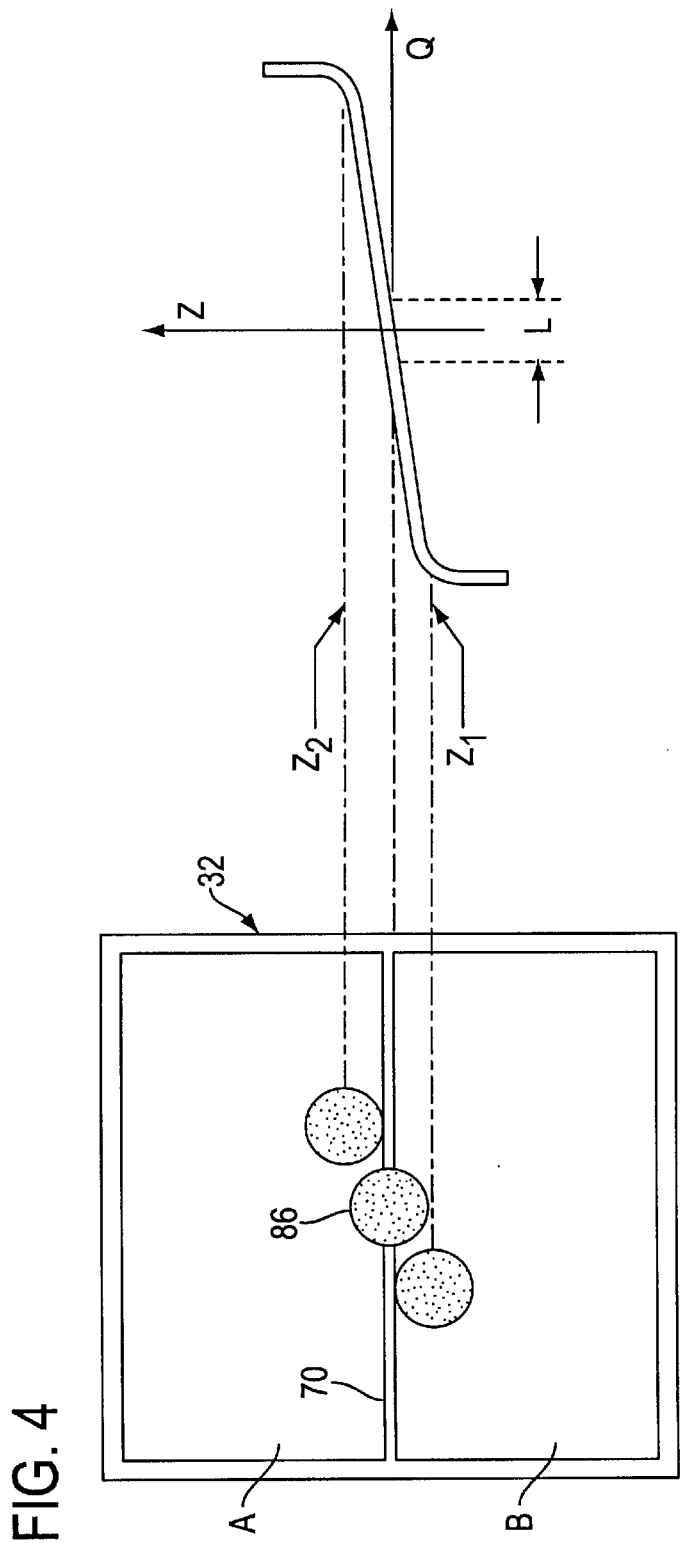
FIG. 4 is a pictorial view of the beam detector, a beam spot, and a graph depicting the output Q of the circuit of FIG. 3.

The operation of the circuit of FIG. 3 can be further understood with reference to FIG. 4, wherein the graph depicts the following function:

$$\text{diff} = A - B \qquad \text{(equation two)}$$

In equation two, the letter A represents the signal amplitude on line 72 (i.e., the magnitude of the signal from photodetector A), and the letter B represents the signal amplitude on line 74 (i.e., the magnitude of the signal from photodetector B). Therefore, equation two represents the output of operational amplifier 80.

For purposes of discussion of the circuit of FIG. 3, it can be assumed that the reflected beam initially strikes only photodetector A. Further for purposes of simplifying the discussion, it can be assumed that operational amplifier 80 has a unity gain. Under these assumptions, the value of the function of equation two will equal the magnitude of signal A (i.e., diff=A). Similarly, if the reflected beam strikes only photodetector B, the value of the function will equal the negative of the magnitude of signal B (i.e., diff=-B). Both situations are shown graphically in FIG. 4.

In situations where the reflected beam simultaneously strikes photodetectors A and B, the value of equation two will equal the quantity diff=A-B, where the magnitudes of signals A and B are proportional to the area of the beam spot 86 which strikes the photodetectors A and B, respectively. Therefore, the output of operational amplifier 80 in such circumstances equals the magnitude of signal A minus the magnitude of signal B. It should be noted that the magnitude of the amplifier output decreases generally linearly within a linear region L as the beam spot traverses line 70 from photodetector A to photodetector B.

Referring again to FIG. 3, the summing amplifier 82 is used to normalize the output of differential amplifier 80. More particularly, the output of differential amplifier 80 can be divided by the output of summing amplifier 82 to provide the following function, Q:

$$Q = (A - B)/(A + B) \qquad \text{(equation three)}$$

The operation of division indicated by equation 3 can be implemented by hardware (i.e. by a divider circuit), but is more conveniently implemented in software within data processing unit 14. As a result of such a normalization operation, measurements provided by the circuit of FIG. 3 can be made insensitive to beam intensity, to changes in the reflectivity from the wafer surface, to signal drift, and to environmental factors.

For calculations based upon information provided by the circuit of FIG. 3, the measurement region of interest is usually only the linear region L (e.g. ten percent) of the region bounded by lines Z1 and Z2 in FIG. 4. Within that region, the amplitude of the quantity (A−B) changes generally linearly with changes in displacement in the z direction. In practice, the approximation to linearity is most exact for a limited range of values about the point where the signal amplitude function intersects the z axis.

Utilizing the above-described process provides a very high-resolution determination of the z position of the beam spot. A typical 20 μm beam spot on the detector 32 will permit the detection of a Δz of about 0.005 μm, or approximately $10^{-8}$ radian. This resolution corresponds to detecting the diameter of a U.S. quarter dollar from a distance of 1500 miles.

This high level of resolution requires that the beam spot fall on the rather narrow linear region L (≈0.01 mm) along the z axis of the detector. If the wafer or other workpiece under test causes a deflection of the beam which would put the beam spot out of the linear region L, the z-stage 46 can be caused to move to bring the spot back into the linear region. Under those circumstances, the z position of the beam spot is obtained by utilizing both the z-stage coordinate and the detector signal. By utilizing the z-stage to effectively extend the linear region of detector 32, the accurate measurement range of the system is greatly expanded.

Figure 5:
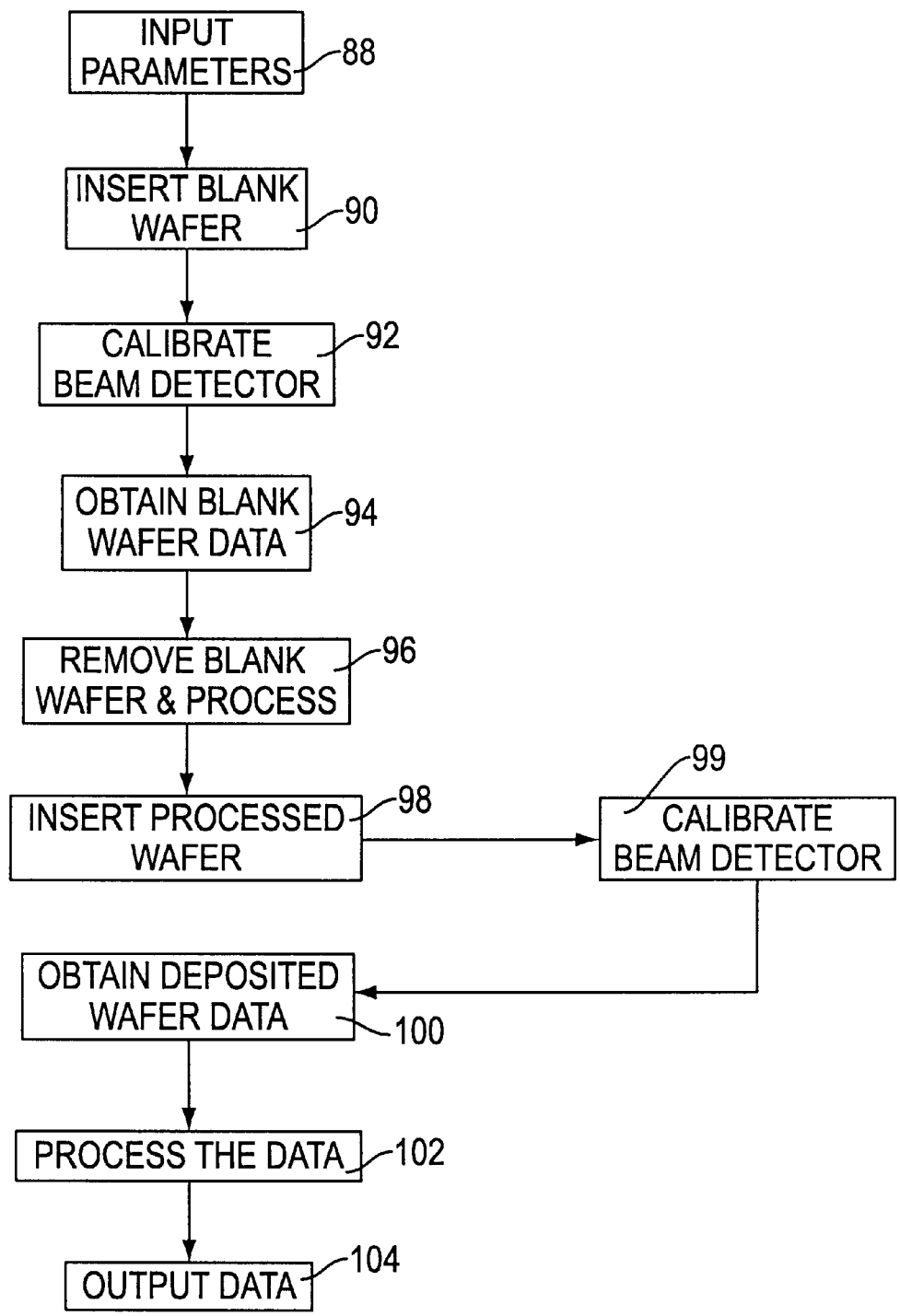
FIG. 5 is a block diagram of a method for measuring surface topography in accordance with the present invention.

The operation of the apparatus 10 when it is being used to measure film stress is illustrated in FIG. 5. In a first step 88, the parameters are entered into the data processing unit 14 such as by keyboard entry. Next, in a step 90, a blank wafer 22 is inserted into the scanning unit 12 and placed on pedestal 20. Preferably, the pedestal 20 is provided with wafer aligning pins (not shown), so the wafer can be replaced on the pedestal in the same position after processing. The beam detector 32 is then calibrated in a step 92. In a step 94, the blank wafer 22 is scanned to provide reference data about its surface topography. Next, in step 96, the blank wafer is removed from the scanning unit 12 and is processed to form a thin film over its surface s. Step 98 calls for the re-insertion of the processed wafer 22 into the scanning unit 12 and onto the pedestal 20 such that it is aligned with the previous blank wafer position. The beam detector 32 is calibrated again in a step 99 for the processed wafer. The processed wafer 22 is then scanned to provide data concerning the surface topography of the processed wafer in a step 100. The data generated by the steps 94 and 100 is processed in a step 102, and an appropriate output of the processed data is made in a step 104.

If the apparatus 10 is simply used to measure topography of the surface of a workpiece, several of the steps of FIG. 5 may be omitted. For example, when measuring the curvature of an uncoated hard disk platter, the process would involve steps 88, 90, 92, 94, 102, and 104, where in step 90 the blank wafer is replaced with the disk platter.

Figure 5A:
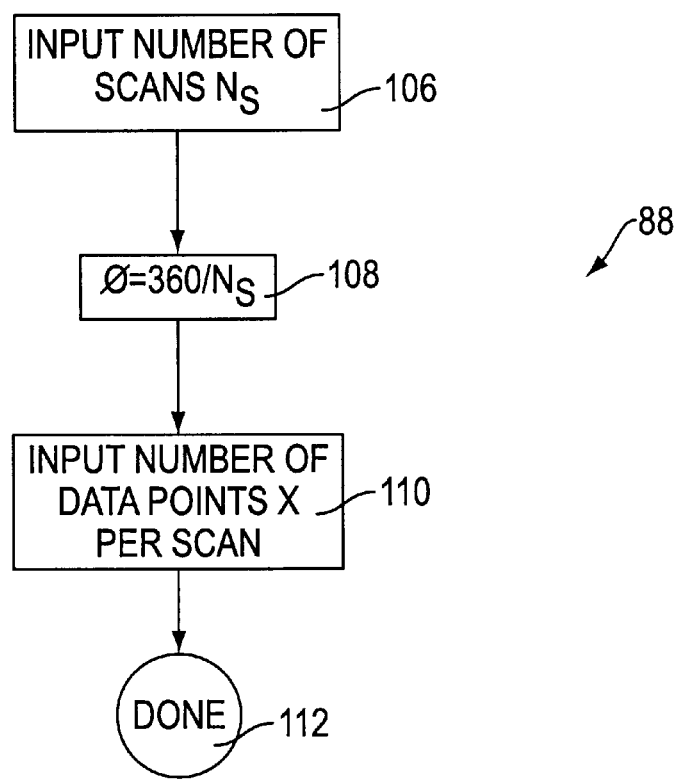
FIG. 5a is a block diagram of the input parameter step 88 of FIG. 5.

FIG. 5a illustrates some of the parameters which may be input as part of input step 88. In an input step 106, the number of scans Ns of the wafer is entered into the data processing unit 14. In the present embodiment of the invention, Ns is in the range of $1 \leq Ns \leq 100$. The incremental angle φ of rotation (in degrees) of the pedestal 20 is then calculated by equation one (i.e. φ=360/Ns) in a calculation step 108. The number of data points X per scan can be input in a step 110. Alternatively, the number of data points X can be set by the system. Other pertinent parameters that could be input as part of input step 88 includes the stress constant of the wafer. The default stress constant for the system is $3.02 \times 10^{18}$ dynes/cm²×A/mm for Silicon <100>. If a wafer other than Silicon <100>is used, the system should be informed in input step 88 so that the stress constant can be adjusted accordingly. After all appropriate parameters have been input into the data processing unit 14, step 88 is completed as indicated at step 112.

A blank wafer 22 is inserted into scanning unit 12 in step 90 for two reasons. First, the blank wafer serves as a reflective surface for the laser beam during the calibrate beam detector step 92. Second, it is desirable to obtain blank wafer data in step 94 to provide reference data concerning any curvature in the wafer prior to film deposition.

Figure 5B:
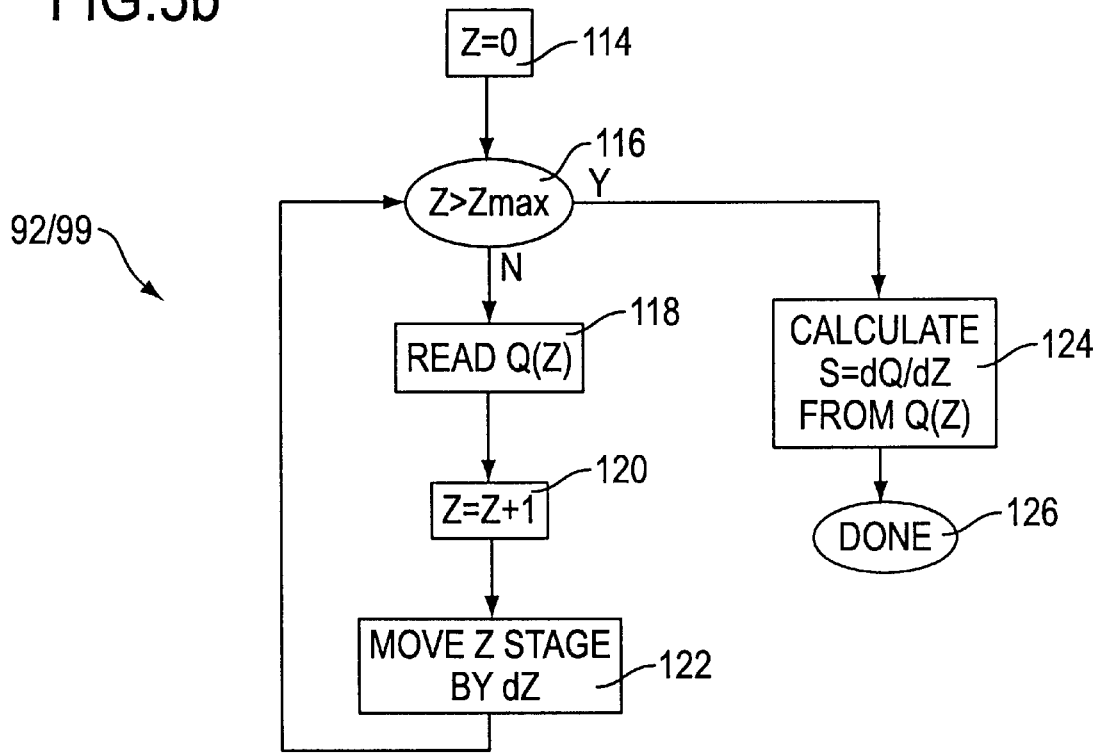
FIG. 5b is a block diagram of the calibrate beam detector step 92 of FIG. 5.

The calibrate beam detector steps 92 and 99 are illustrated in greater detail in FIG. 5b. For these calibration steps, the wafer 22 is held in a stationary position on pedestal 20, and the x stage 56 is immobilized. For calibration purposes, z stage 46 is driven in the z direction by stepper motor 54, thereby causing the beam spot 86 to move across the face of the beam detector 32. As stage 46 is driven in the z direction, its displacement is monitored via stepper motor 54. Then, the value of Q can be calculated by equation three to provide a measure of the change in value dQ of relative displacements dZ of the stage 46. In other words, knowledge of changes in the function Q with discrete z direction displacements of stage 46 enables a function dQ/dZ to be calculated. In essence, this function expresses the slope of the normalized version of the graph of FIG. 4 within the limits of the lines Z1 and Z2, and more particularly in the linear region L.

In FIG. 5b, the calibration steps 92 and 99 are therefore implemented by setting a counter Z to zero in a step 114 and then comparing Z with Zmax in step 116, where Zmax is the maximum number of steps to be taken in the Z direction. If Z is less than Zmax, Q(z) is calculated, and Z is incremented by one in step 120. The z stage 46 is then moved in the Z direction by dz, and Z is once again compared to Zmax. Steps 118–122 are repeated until Z>Zmax. The slope S is calculated by a least square fit of the data points within the linear region L. The step 92 is then completed as indicated at 126.

Figure 5C:
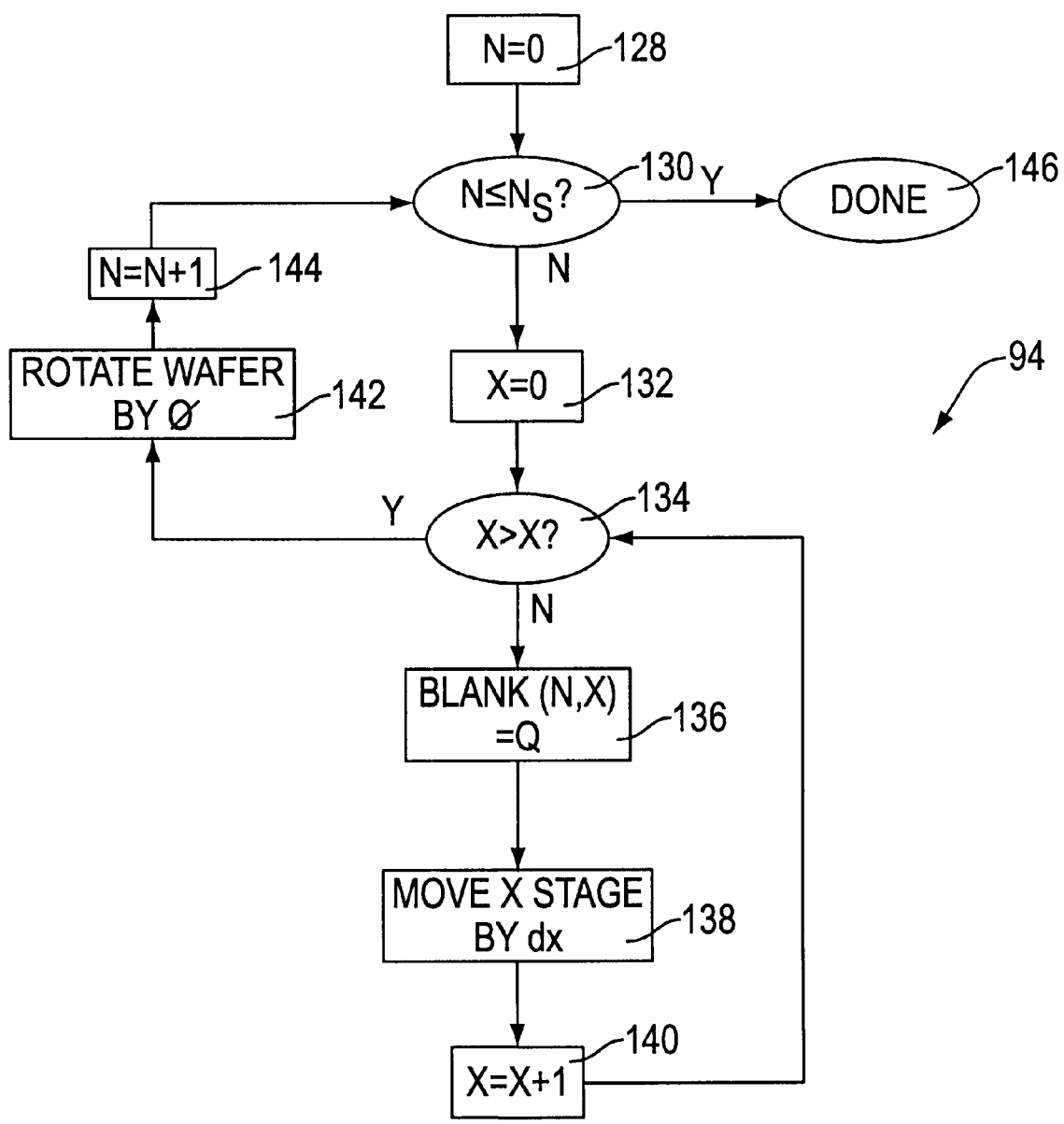
FIG. 5c is a block diagram of the obtain blank wafer data step 94 of FIG. 5.

Once the beam detector is calibrated in step 92, data is obtained concerning the topography of the blank wafer 22 in a step 94. In FIG. 5c, the step 94 includes setting a counter N to zero in a step 128 and comparing N to the number of scans Ns in a step 130. If $N \leq Ns$, then the counter X is set to zero in a step 132 and compared to X in a step 134, where X is the number of data points in a scan. If X>X, then BLANK(N,X) is set to the value of Q (equation three) at that point in a step 136. The x stage is then moved by an amount dx in a step 138, and the counter X is incremented by one in a step 140. Steps 136–138 are repeated until X>X, at which time the wafer 22 is rotated by φ degrees in a step 142. The counter N is then incremented by one in step 144, and steps 130–144 are repeated until N is determined to be greater than Ns in step 130, at which time step 94 is completed as indicated at 146.

After obtaining the blank wafer data, the wafer 22 is removed from the scanning unit and processed to form a film on the upper surface s. In a step 98, the wafer 22 is then placed back upon pedestal 20 in the same position that it was previously as determined by alignment pins (not shown) provided on the pedestal.

Figure 5D:
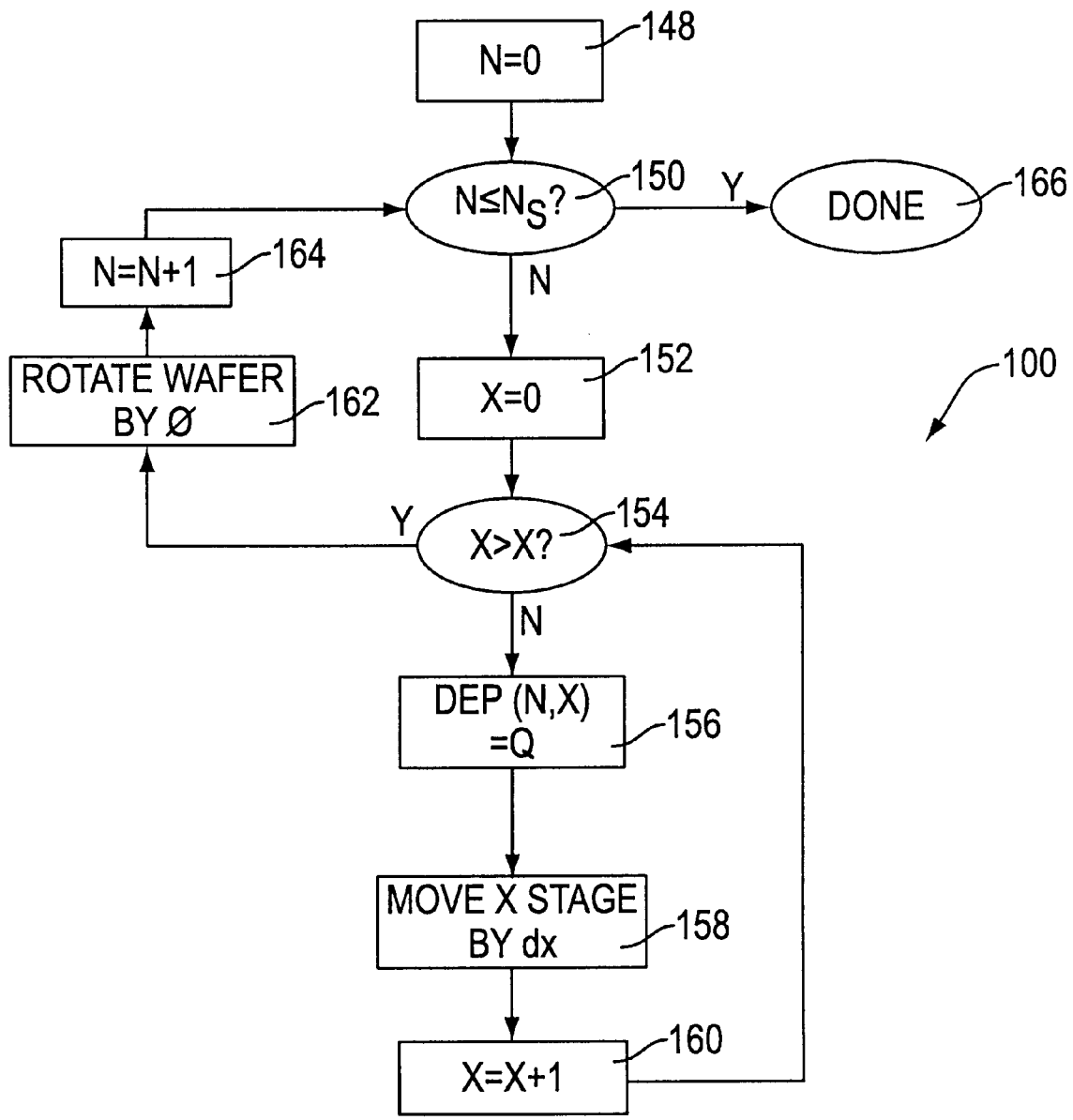
FIG. 5d is a block diagram of the obtain deposited wafer data step 100 of FIG. 5.

The step 100 of obtaining deposited wafer data, is illustrated in greater detail in FIG. 5d. Step 100 begins with setting counter N to zero in a step 148, and then comparing N to Ns in step 150. If $N \leq Ns$, the counter X is set to zero in a step 152 and X is compared to X in step 154, where X is the number of data points to be taken in a scan of the wafer. The data DEP(N,X) is set to the value of Q (equation three) in a step 156, and the x stage 56 is then moved by dx in a step 158. The counter X is then incremented by one in step 160, and X is again compared with X in step 154. As long as $X \leq X$, steps 156 and 158 are repeated. When X>X, the wafer 22 is rotated by φ in a step 162, and the counter N is incremented by one. Steps 150–164 are repeated until N>Ns, at which point step 100 is completed, as indicated at 166.

Figure 5E:
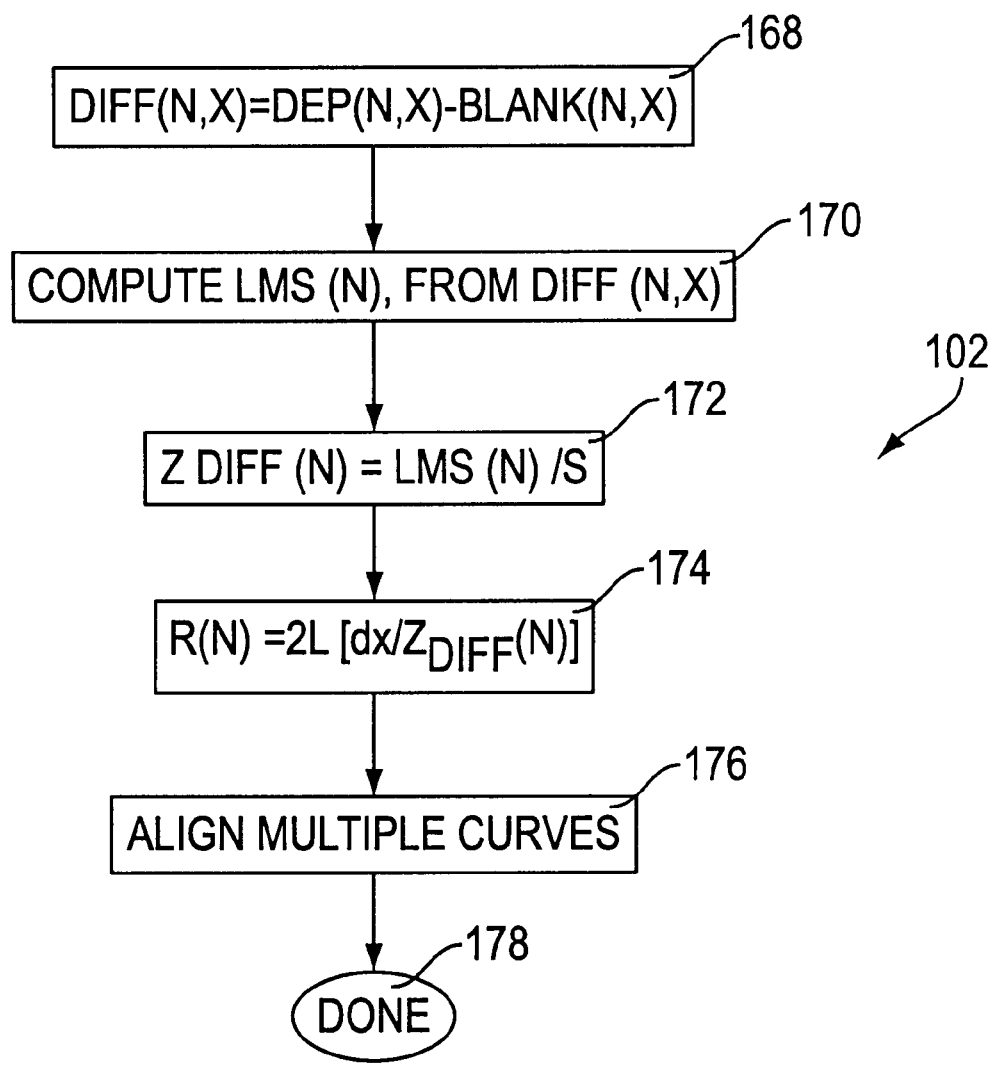
FIG. 5e is a block diagram of the process data step 102 of FIG. 5.

The next step 102 is to process the BLANK(N,X) and DEP(N,X) data to provide Ns sets of data relating to the displacement of the deflected beam Bd. An example of the processing step 102 is illustrated in FIG. 5e. In a first step 168, a set of DIFF(N,X) data is calculated by subtracting the BLANK(N,X) data from the DEP(N,X) data. The value of the data DIFF(N,X) for any give N and X is simply DEP(N,X)−BLANK(N,X) for that given N and X. This operation removes the effect of any pre-existing curvature on the blank wafer 22 so that the curvatures derived from DIFF(N,X) will be related primarily to the curvature created by the stresses created by the film applied to the wafer. Next, in a step 170, the least mean square (LMS) of the DIFF(N,X) data is calculated to fit a best fit straight line to the DIFF (N,X) data. Therefore, there will be Ns LMS(N) values if a single straight line is used to approximate the data points of DIFF(N,X) for each scan, where LMS(N)=mx+b, m being the slope and b being the z axis intersection. Alternatively, a number of LMS approximations of discrete subsets of the data DIFF(N,X) can be made if the curvature of radius of the surface of the wafer varies greatly across a particular scan.

In step 172 the values of LMS(N) are converted to Z displacements by the use of equation four:

$$ZDIFF(N)=LMS(N)/S+c \quad \text{(equation four)}$$

where S was given by equation four and c is a constant. Step 174 converts the displacement data to radii of curvature by using equation five, below:

$$R(N)=2Ld\{dx/ZDIFF(N)\}+c \quad \text{(equation five)}$$

where Ld is the distance traveled by the beam after reflection from the wafer surface 22 (i.e. Br+Bd) and dx is the distance of translation of the x stage 56 to create the Z displacement ZDIFF(N). Finally, in a step 176, the curvatures related to the multiple scans Ns are aligned to each other and the step 102 is completed as indicated at 178.

Figure 5F:
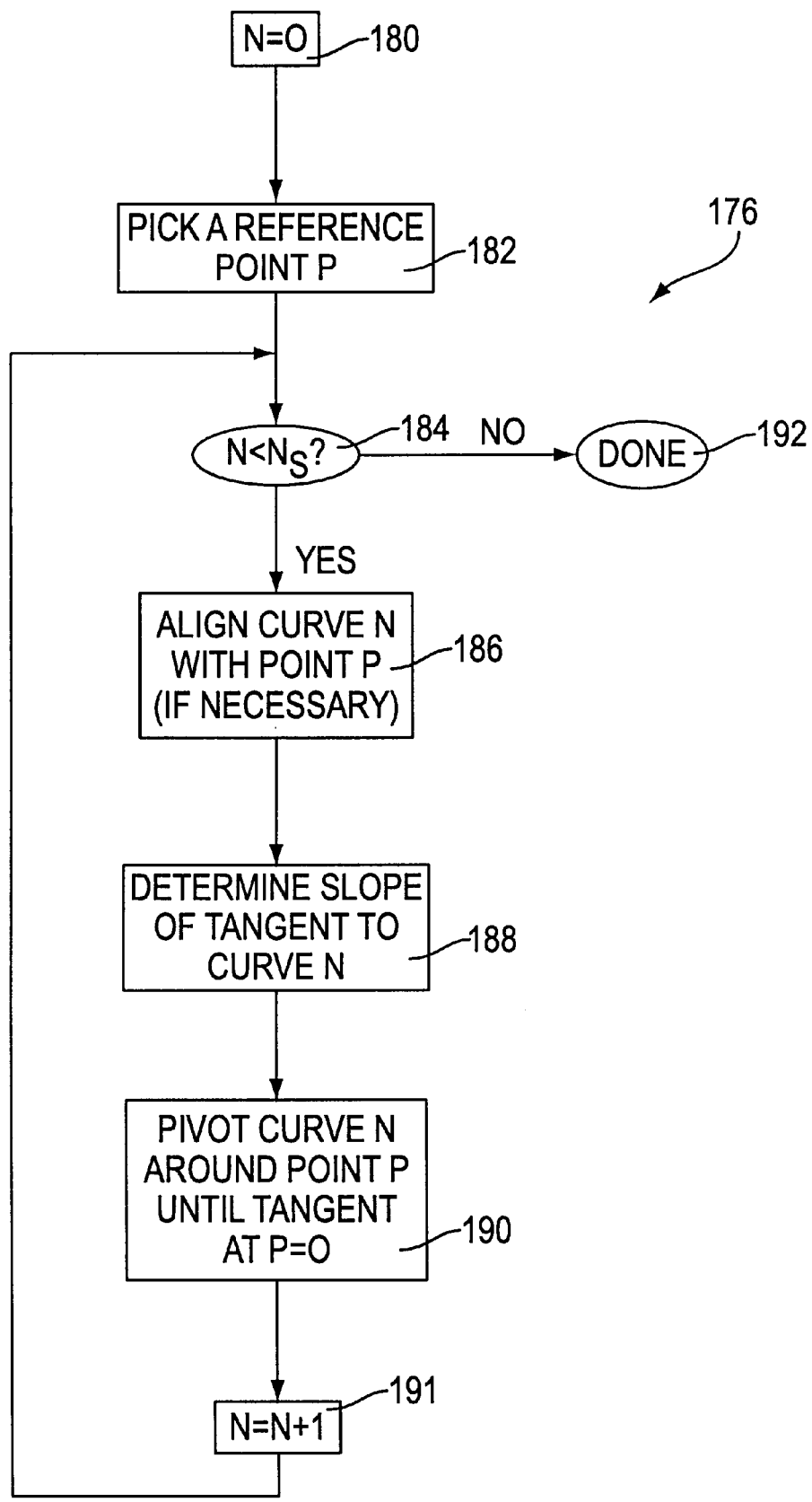
FIG. 5f is a block diagram of the align multiple curves step 176 of FIG. 5e.
Figure 8:
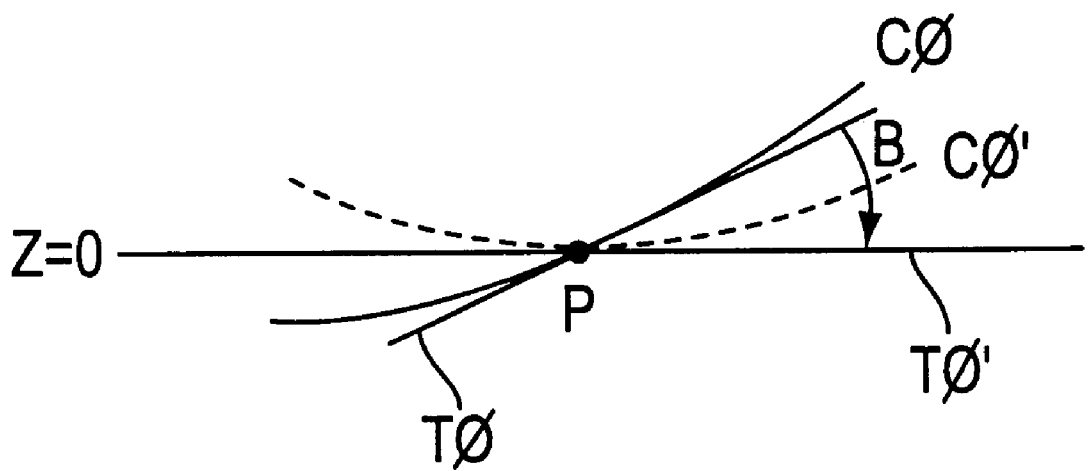
FIG. 8 is used to further illustrate the align multiple curves step 176 of FIGS. 5e and 5f.

The alignment step 176 is illustrated in greater detail in FIG. 5f. First, in a step 180, the counter N is set to zero. In step 182, a reference point P is chosen. Preferably, P is the centerpoint (i.e. the X/2 datapoint) of curve N=0 because this point should be in common with all of the curves. In a decision step 184, the current value of N is compared with Ns. If N is less than Ns, curve N is aligned with point P, if necessary, in step 186. This step 186 will not be necessary for curve N=0. Next, in step 188, the slope of the tangent to curve N is calculated. In step 190, the curve N is pivoted around point P until the tangent to the curve is zero. This step is illustrated in FIG. 8 where the tangent T0 has an angle β to the z=0 axis. The curve C0 is then pivoted around P by β degrees until the tangent T0' of curve C0' is equal to zero. The counter N is then incremented by one in a step 191, and steps 186–191 are repeated until N is greater than or equal to Ns, at which time step 176 is terminated as indicated at 192.

FIG. 6 is a graph illustrating some of the data for a single scan N of the wafer. In this graph, the horizontal axis is the X axis, and the vertical axis is the Z axis. A first curve 194 represents the data BLANK(N,X) for a particular scan N and a second curve 196 represents the data DEP(N,X) for scan N. Curve 198 represents DIFF(N,X) for scan N, and line 200 represents LMS(N). The curve 202 is calculated from the LMS(N) data, and represents the curvature data for the surface of wafer 22 taken along a particular scan line N.

In FIG. 7, six curves C0, C1, C2, C3, C4, and C5 (i.e. Ns=6) are illustrated. Each of these curves are separated by the angle φ in the x-y plane. Due to the constant c, the curves are not all perfectly aligned.

Step 102 of FIG. 5 calls for the processing of the data. This step can take many forms. For example, the accumulated curvature data can be used to calculate thin film stress by utilizing algorithms well known to those skilled in the art. The data processing step 102 can also prepare the data for various forms of graphical output.

Figure 9:
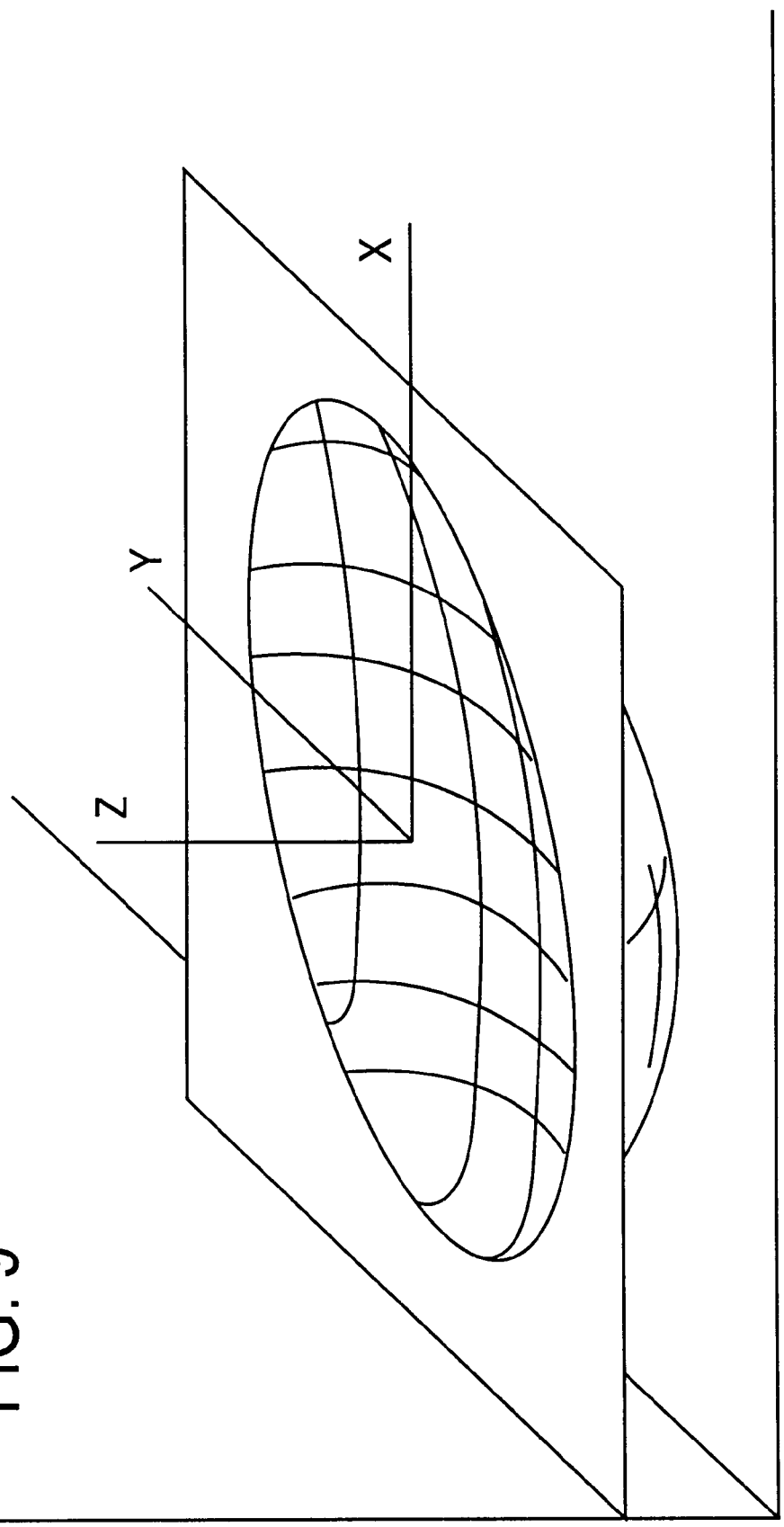
FIG. 9 illustrates the output data step 104 of FIG. 5 wherein the multiple scans of the wafer surface are used to display a three-dimensional representation of the curvature of the wafer surface.

Step 104 of FIG. 5 calls for the outputting of data. The stresses along the various scan lines as calculated by step 102 can be output in conventional tabular form. Another form of data output is illustrated in FIG. 9. Here, the Ns scans of the wafer have been presented in three dimensional form by providing the curves C(0) . . . C(Ns) to a commercial 3-D rendering program or by utilizing well-known 3-D rendering algorithms. The present invention can therefore be used to provide three dimensional representations of the topography of a wafer surface.

Figure 10:
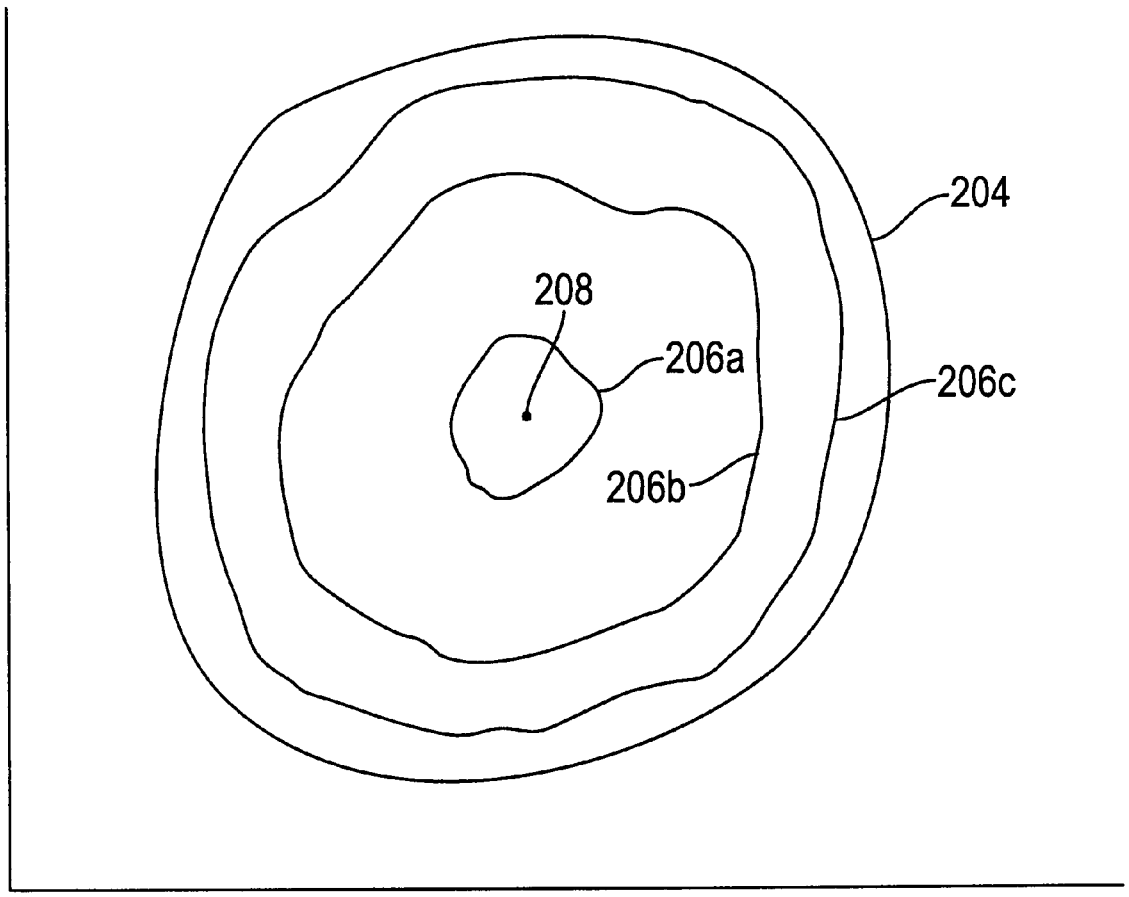
FIG. 10 illustrates the output data step 104 of FIG. 5 wherein the multiple scans of the wafer surface are used to display a two-dimensional contour map of the wafer surface.

FIG. 10 illustrates a still further type of output data which can be provided by step 104. The perimeter 204 is the circumference of wafer 22 and the contour lines 206a, 206b, and 206c represent points of equal height relative to a reference point 208. This "contour mapping" of the surface of wafer 22 provided yet another way of presenting the curvature or flatness of the surface s. Algorithms for creating contours are well known to those skilled in the art.

While this invention has been described in terms of several preferred embodiments, it is contemplated that alterations, modifications and permutations thereof will become apparent to those skilled in the art upon a reading of the specification and study of the drawings. It is therefore intended that the following appended claims include all such alterations, modifications and permutations as fall within the true spirit and scope of the present invention.

What is claimed is:

1. An apparatus for measuring surface topography comprising:
   a pedestal receptive to a workpiece having a surface to be measured for curvature;
   a source capable of developing a beam of radiant energy that can be directed at said surface of said workpiece;
   a scanning mechanism capable of creating a relative motion between said beam of radiant energy and said surface of said workpiece such that said beam of radiant energy is scanned in a scanning direction over at least a portion of said surface;
   a detector positioned to detect a reflected portion of said beam, said detector developing output data related to the curvature of a series of points on said surface; and
   an adjusting mechanism capable of adjusting the angular position of said surface relative to said scanning direction such that a plurality of scans of said surface can be made.

2. An apparatus as recited in claim 1 further comprising a computer responsive to said output data and operative to develop curvature data for said surface.

3. An apparatus as recited in claim 2 wherein said surface is provided with a film, and wherein said computer further produces film stress data from said curvature data.

4. An apparatus as recited in claim 1 wherein said pedestal comprises a rotatable pedestal and wherein said adjusting mechanism comprises a motor coupled to said pedestal to selectively rotate said pedestal.

5. An apparatus as recited in claim 4 wherein said motor comprises a stepper motor capable of rotating said pedestal by an angle φ between adjacent scans of said surface.

6. An apparatus as recited in claim 5 wherein said stepper motor rotates said pedestal by an angle φ=360/Ns, wherein Ns is the number of scans to be made of said surface.

7. An apparatus for measuring surface topography comprising:

a pedestal receptive to a workpiece having a surface to be measured for curvature;

a laser capable of developing a laser beam that can be directed at said surface of said workpiece;

a scanning mechanism capable of creating a relative motion between said laser beam and said surface of said workpiece such that said laser beam is scanned in a scanning direction over at least a portion of said surface;

a detector positioned to detect a portion of said laser beam reflected from said surface, said detector developing output data related to the curvature of said surface; and an adjusting mechanism capable of changing the angular position of said surface relative to said scanning direction such that a plurality of scans of said surface can be made.

8. An apparatus as recited in claim 7 further comprising a mirror, wherein said reflected portion of said laser beam is reflected from said mirror to said detector.

9. An apparatus as recited in claim 7 wherein said changing of said angular position by said adjusting mechanism includes rotating said surface of said workpiece.

10. An apparatus as recited in claim 7 wherein said output data includes a plurality of points describing said curvature of said surface.

11. An apparatus as recited in claim 7 wherein said workpiece is a wafer.

12. An apparatus as recited in claim 7 further comprising a data processing device responsive to said output data and operative to develop curvature data for said surface.

13. An apparatus as recited in claim 8 wherein said surface is provided with a film, and wherein said data processing device further produces film stress data from said curvature data.

14. An apparatus for measuring surface topography comprising:

a support capable of supporting a workpiece having a surface to be measured for curvature;

a beam source capable of directing a beam of electromagnetic radiation at said surface of said workpiece;

a detector positioned to detect a portion of said beam reflected from said surface and provide output data related to said curvature of said surface; and a movement mechanism operative to provide a relative motion between said beam and said surface of said workpiece such that said beam moves over a portion of said surface of said workpiece in a beam direction, said movement mechanism also operative to change an angular position of said surface relative to said beam direction to allow said beam to be moved in different beam directions over said surface of said workpiece.

15. An apparatus as recited in claim 14 wherein said movement mechanism includes:

a scanning mechanism capable of creating said relative motion between said beam and said surface; and an adjusting mechanism capable of changing said angular position of said surface relative to said beam direction.

16. An apparatus as recited in claim 14 further comprising a digital apparatus responsive to said output data and operative to develop curvature data for said surface.

17. An apparatus as recited in claim 16 wherein said surface is provided with a film, and wherein said digital apparatus further produces film stress data from said curvature data.

* * * * *